US007920990B2

(12) United States Patent
Nicholls et al.

(10) Patent No.: US 7,920,990 B2
(45) Date of Patent: Apr. 5, 2011

(54) APPARATUS AND METHODS OF DEFINING SPECTRAL REGIONS OF INTEREST FOR SIGNAL ANALYSIS

(75) Inventors: Richard B. Nicholls, Portland, OR (US); John F. Short, III, Tigard, OR (US); Walter R. Strand, Portland, OR (US); Lynne A. Fitzsimmons, Portland, OR (US); David W. Schmidt, Portland, OR (US); Ronald J. Larrick, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 261 days.

(21) Appl. No.: 12/174,588

(22) Filed: Jul. 16, 2008

(65) Prior Publication Data

US 2009/0125259 A1 May 14, 2009

(51) Int. Cl.
*G01R 23/00* (2006.01)
*G06F 17/00* (2006.01)
(52) U.S. Cl. ............. 702/190; 702/68; 702/73; 702/76; 324/76.19
(58) Field of Classification Search .................. 702/190, 702/68, 73, 76
See application file for complete search history.

(56) References Cited

U.S. PATENT DOCUMENTS

| 4,801,873 | A | * | 1/1989 | Takano | 324/76.12 |
| 5,874,916 | A | * | 2/1999 | Desjardins | 342/378 |
| 2004/0028003 | A1 | * | 2/2004 | Diener et al. | 370/319 |
| 2006/0044389 | A1 | * | 3/2006 | Chai et al. | 348/143 |
| 2007/0203645 | A1 | * | 8/2007 | Dees et al. | 701/212 |

OTHER PUBLICATIONS

Bergstrom, C., et al., "Software Defined Radio (SDR) Special Military Applications", Military Communications Conference, Milcom 2002, Anaheim, CA, Oct. 10, 2002, pp. 383-388.

* cited by examiner

*Primary Examiner* — Hal D Wachsman
(74) *Attorney, Agent, or Firm* — Matthew D. Rabdau; Michael A. Nelson

(57) ABSTRACT

Apparatus and methods are provided to allow multiple, possibly overlapping, regions of interest within a frequency spectrum to be defined, and managed. Each of these regions of interest may be selected for further testing or identification. Unselected regions are allowed to collapse into narrow bars so as not to interfere with the selected region. Multiple rows are provided to allow for the definition and selection of overlapping regions of interest. Furthermore, in some embodiments aid is provided for identifying the signal type by providing a list of signal type candidates based upon such parameters as region of interest bandwidth, region of interest center frequency and geographic location.

6 Claims, 4 Drawing Sheets

APPARATUS AND METHODS OF DEFINING SPECTRAL REGIONS OF INTEREST FOR SIGNAL ANALYSIS

CROSS-REFERENCE TO RELATED CASES

This application claims the benefit of U.S. Provisional Application No. 60/950,109 filed Jul. 16, 2007, the entire contents of which are incorporated herein by this reference for all purposes.

TECHNICAL FIELD

The present invention relates to radio frequency (RF) signal measurements, and more particularly to selecting regions within a frequency spectrum.

BACKGROUND

In measuring and testing RF systems, multiple signals may be present, both known and unknown. A frequency spectrum, such as that generated by a spectrum analyzer or similar instrument, provides a convenient way to visualize and present these signals to a user. One of more of these signals may be of interest. A skilled operator, technician or engineer may manually adjust the measurement parameters to make measurements on a specific signal of interest from among the signals present. The relevant measurements may depend upon the type of signal to be measured. Skilled operators may be sufficiently familiar with the signals they are working with to be able to identify them for further measurements.

In normal field testing and measuring conditions it is not uncommon to employ less skill technicians for making the necessary measurements. These operators may not have the necessary skill and experience to discriminate and identify the signal types or be capable of making fine adjustments to the instrument to isolate and measure specific signals within the frequency spectrum.

SUMMARY

Accordingly, embodiments of the present invention provide a mechanism for allowing an operator to define one or more regions of interest and to select a specific area of interest for further action. In some embodiments, the selected region of interest defines parameters for making further measurements without the need to change the global instrument settings. Each unselected region collapses to form a narrow bar just outside the area of the selected region of interest. Multiple rows are provided for the narrow bars to allow overlapping regions to be defined and selected.

Embodiments of the present invention also allow signal type candidates to be presented to an operator based upon, the bandwidth of the selected region of interest, the center frequency of the selected region of interest or both. In further embodiment, the signal type candidates may be further narrowed based on the geographic location of the instrument at the time of the measurement.

Embodiments of the present invention include a method of managing regions of interest in a measurement instrument by obtaining a frequency spectrum; assigning an initial row value to a region of interest; checking the region of interest against other regions of interest to determine if there is an overlap; and changing the initial row value of the region of interest when there is an overlap. The initial row value may be set to zero and incremented as necessary to avoid an overlap. The steps may be performed each time a region of interest is defined, selected or unselected. In some embodiments a warning may be provided when all row values produce an overlap.

Embodiments of the present invention may also include a method of identifying a signal type by obtaining a frequency spectrum; determining a bandwidth of a region of interest; searching a database for signal types within a specified tolerance of the bandwidth; determining a center frequency of a region of interest; searching a database for signal types within a specified tolerance of the center frequency; and providing a list of possible signal type candidates. In some methods, narrowing the list of possible signal type candidates based upon geographic location of a measure being taken is also performed. The geographic location may be determined based upon global positioning system (GPS) or user entry.

Aspects of the various embodiments of the present invention will become apparent from the following detailed description when read in conjunction with the appended claims and attached drawings.

DETAILED DESCRIPTION

Figure 1:
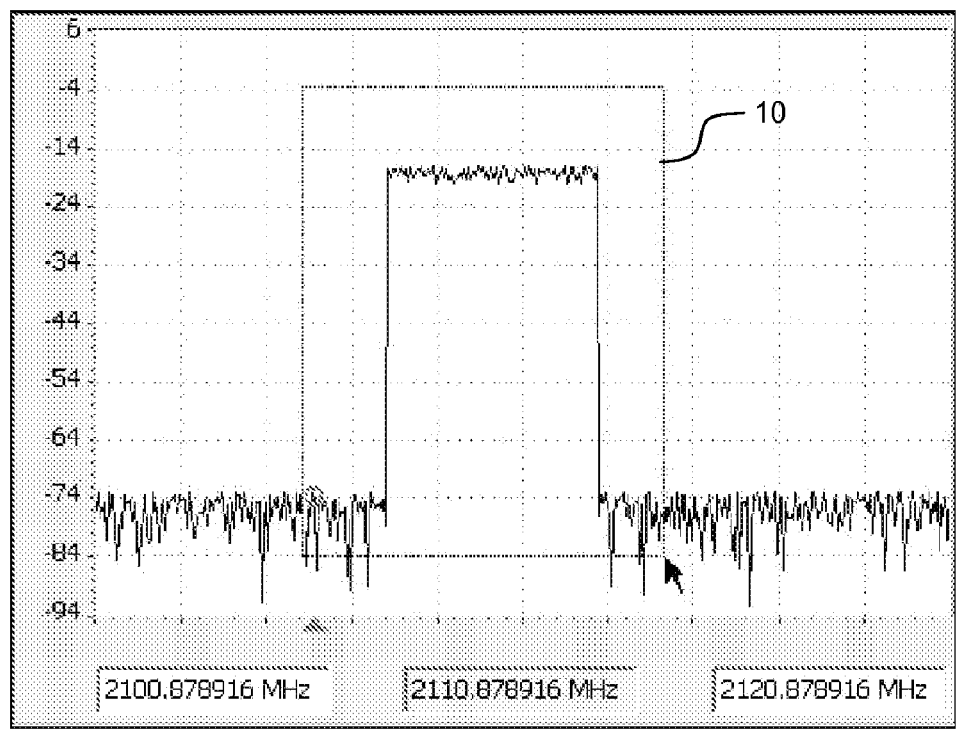
FIG. 1 illustrates a frequency spectrum as displayed on a measurement instrument with a region of interest being selected.

A frequency spectrum is shown on the display of a measurement instrument in FIG. 1. A selection box is drawn to define a region of interest 10. The region of interest 10 may be drawn using a finger or other pointing device on a touch screen. In an alternative embodiment a mouse, a stylus pad or other suitable pointing device is used to control the drawing of the selection box to define a region of interest on the display of the measurement instrument, or analysis application running on a computer.

In an embodiment of the present user interface, the frequency dimension, shown here as the horizontal dimension, is more critical than the vertical dimension. In this case the height of the rectangle is predetermined based upon design preference, such that the height of the rectangle is set regardless of actual region selected. The region of interest 10 is determined by the starting point frequency and the ending point frequency being drawn on the display. In an alternative embodiment, a center frequency and a bandwidth may be set.

In an alternative embodiment, the region of interest is defined by entering frequency values. The frequency values may be entered using a keyboard, and selecting the desired field to enter data into, or modify, and then keying in the desired value. A starting frequency and an ending frequency may be entered to define the region of interest. A center frequency and a bandwidth may also be used to define a region of interest.

Figure 2:
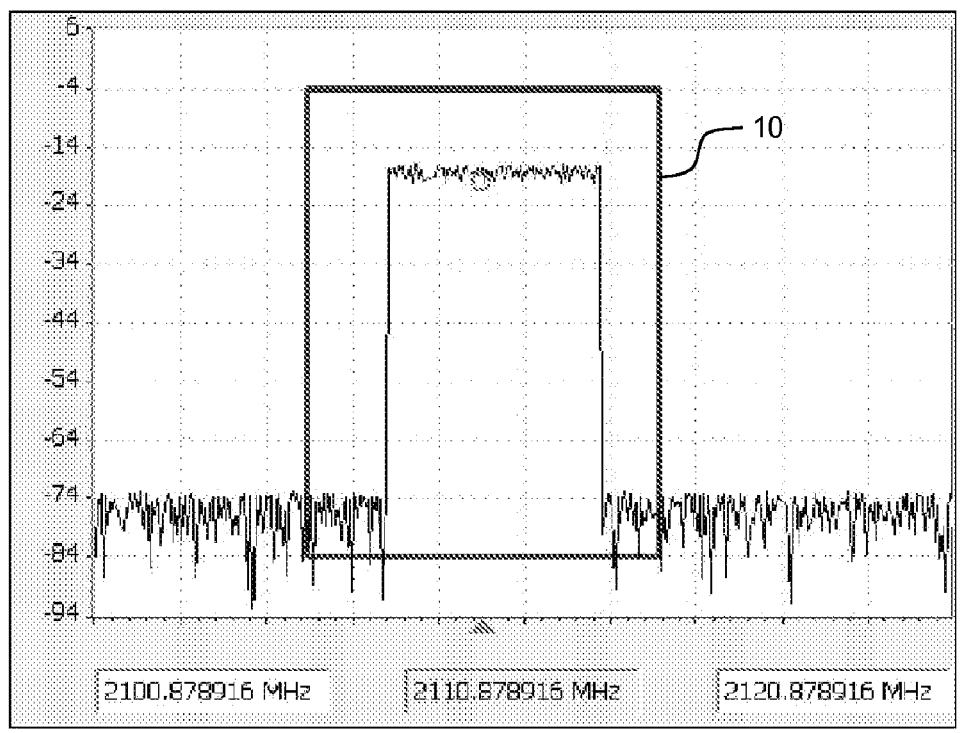
FIG. 2 illustrates a frequency spectrum as displayed on a measurement instrument with a selected region of interest.

In a further embodiment, once a region 10 of interest is defined as shown FIG. 2, the definition can be modified to redefine the region of interest. For example, a rough rectangle could be drawn and each edge of the region of interest could be selected and dragged to select a new starting frequency or a new ending frequency. Alternatively, by selecting within the region of interest, the box defining the region of interest would be re-centered around a new center frequency. The entire box could be selected and dragged to redefine the region of interest to a completely new range of frequencies. As discussed above this could also be accomplished by providing frequency values for the starting frequency and the ending frequency, or the center frequency and the bandwidth. A combination of drawing to approximately define a region of interest and then providing frequency values to further define the region may also be used.

In a further embodiment, once a region of interest is defined, the defined region is used to provide control parameters to a measurement engine. In the absence of a defined region of interest 10, the user could change the measurement by adjusting the span, which would also change the display to show the new span. With a region of interest 10 defined, the measurement engine uses the frequency boundaries of the specified region of interest to control the bandwidth of the acquisition. This allows a user to uniquely analyze portions of the total displayed frequency spectrum without having to adjust the global settings of the spectral display. Typically, the measurement engine is acquiring RF energy pursuant to displaying the entire frequency spectrum using the global settings for center frequency and span, not just the frequency range of interest. By using a displayed region of interest to set the center frequency and bandwidth that is independent from the global settings used for providing the total spectrum display, the user is able to obtain a unique acquisition without having to adjust the global settings.

Figure 3:
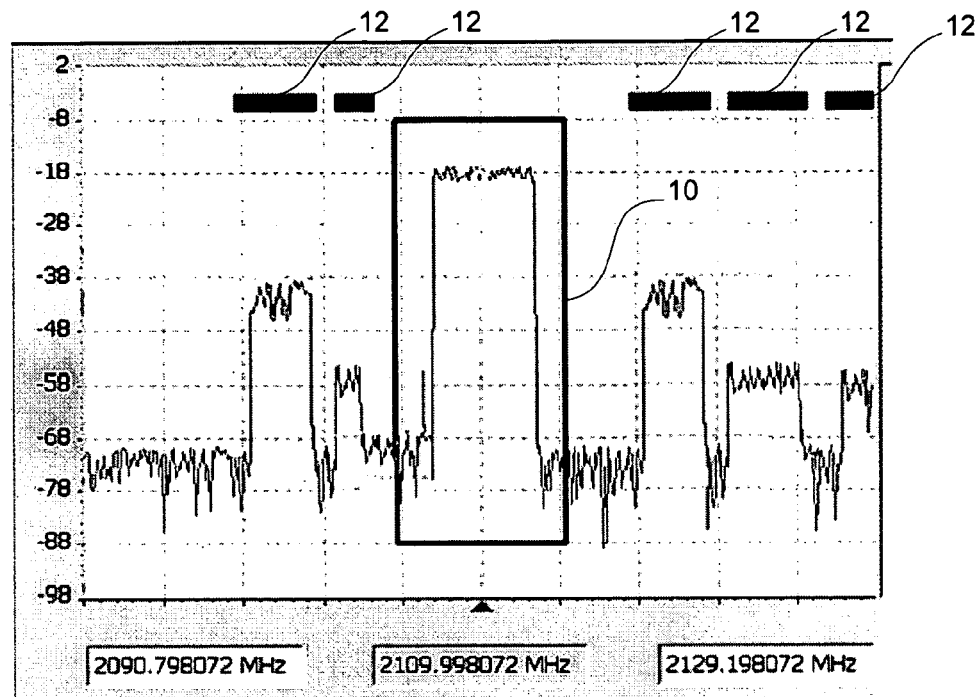
FIG. 3 illustrates a frequency spectrum as displayed on a measurement instrument with a selected region of interest and unselected regions of interest.

While being able to define a single region of interest has some advantages for making measurements without adjusting global settings, these advantages are further realized in an embodiment of the present invention allowing multiple regions of interest to be defined and then selected. As shown in FIG. 3, multiple regions of interest have been defined and one region of interest has been selected and is active. The non-selected regions of interest 12 have been collapsed into bars along the top of the display. In an alternative embodiment, the non-selected regions of interest are collapsed into bars along the bottom of the display. In yet another embodiment, unselected regions of interest may be collapsed into bars along both the top and bottom of the display.

Only selected regions of interest 10 are used for measurements, as these regions are considered active. The inactive regions correspond to the unselected regions that are represented by the bars. If the user wishes to make a measurement related to an unselected region of interest, it is selected by the user and the previously selected region collapses into a bar. By selecting a bar corresponding to an unselected region of interest, the user causes the region to expand to identify the selected region of interest 10.

Alternatively, the region may be selected by stepping left-to-right or right-to-left through the available unselected regions of interest. In one embodiment, stepping may be accomplished by clicking on arrows on the display, such as in the case of a touch screen. Alternatively, stepping is done by using corresponding keys on a keyboard, for example left and right arrow keys. In an embodiment of the present user interface, the regions are arranged by their start frequency value.

If the next region selected is not currently displayed, the display pans left or right. In some embodiments, the display will center on the selected region of interest. In some embodiments this may cause the start and stop frequencies of the global spectrum display to change to include the bandwidth of the next/previous region such that the entire region can be seen on the spectrum display.

Figure 4:
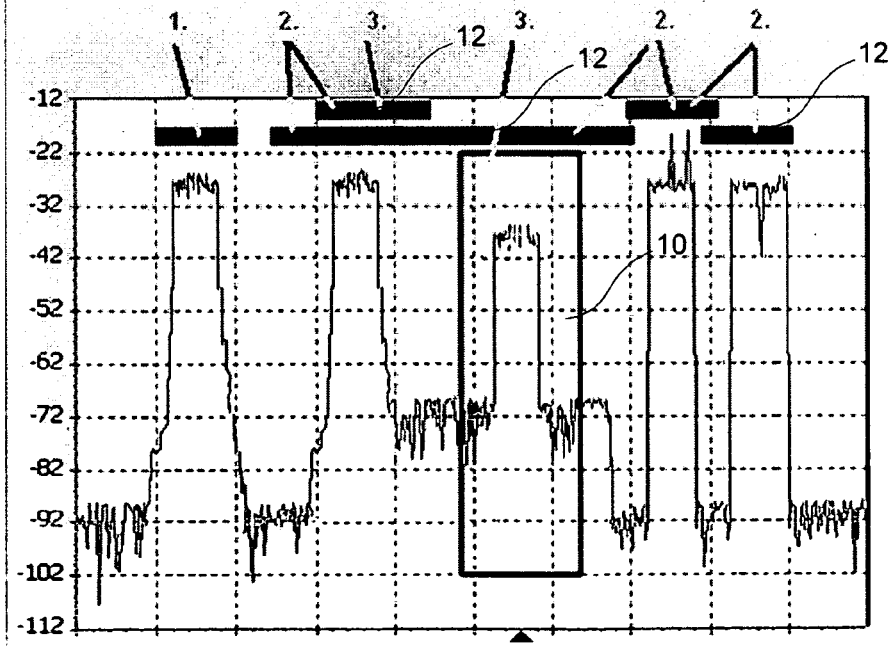
FIG. 4 illustrates a frequency spectrum as displayed on a measurement instrument with two rows of unselected regions of interest.

In some situations the user may wish to define regions of interest that have overlapping frequency ranges. In an embodiment of the present invention, when a user defines a region of interest that overlaps an existing region of interest the older region collapses into a bar as described above. If the newly defined overlapping region is no longer the selected region, it will collapse into a bar as well. To avoid interference between overlapping bars multiple rows of bars are provided, as shown in FIG. 4. By providing multiple rows of bars representing unselected regions of interest, the measurement instrument is able to display the defined regions and their relationship to other defined regions of interest to the user, as shown in FIG. 4. FIG. 4 illustrates two rows of unselected defined regions of interest 12, however, in alternative embodiments additional rows may be provided.

In an embodiment of the present invention, when a new region is defined, the row that it will collapse into when unselected is determined to avoid overlapping regions of interest on the same row. In this case, overlap refers to two or more regions whose start and stop frequency values encompass at least one common frequency value. To accomplish this, the new region of interest, which may also be referred to as a "region under test" is tested against all existing regions for overlap. In an alternative embodiment, the overlap testing is performed when the region becomes unselected.

The purpose of this process is to assign a unique value to the region under test which is different from all of the other regions which share common frequencies, i.e. overlap. In an embodiment of the present invention, the unique value corresponds to the row that the bar will collapse to.

This process works because it is used each time a new region (i.e. the region under test) is created, or alternatively unselected, thereby finding and assigning a non-overlapping value to the region.

1) Start by assigning the region under test the smallest value (i.e. 0), which would correspond to a first row. The row could be either above or below the spectrum.

2) Check against each existing region sharing the value, or row, for overlap. This is accomplished by 2a) Finding regions whose start and stop frequencies encompass only the left edge (i.e. start frequency) of the region under test.

2b) Finding regions whose start and stop frequencies encompass only the right edge (i.e. stop frequency) of the region under test.

2c) Finding regions whose start and stop frequencies are such that the region under test is wholly contained within the region being compared against, or are such that the region being compared against is wholly contained within the region under test.

3) Any time a region is found for which one of the conditions 2a-2c is determined true, the region under test is set to a value unique from the region compared against which caused the true condition. One possible mechanism is to add one to the value for the region under test, which would correspond to selecting the next row.

4) When the value for the region under test is changed, the algorithm is repeated from the start (step 1) for all existing regions. This continues until the region under test is found to have a value unique from all other regions with which it shares frequency values.

When all available values, corresponding to rows, have been checked unsuccessfully, a warning is provided to the user. In response to this warning, the user may redefine the region to avoid overlap. Alternatively, the user may delete those regions causing the overlap, and then redefine the region of interest as desired.

In an embodiment of the instrument, the selection of an unselected region of interest takes precedence over other objects on the display. Accordingly, if two regions are too close to easily select using a finger on a touch screen, even if the first selection is incorrect, that region will become a selected region such that the next selection using the touch screen will select the desired unselected region. As embodiments of the present invention are directed toward portable test equipment using touch screens, this feature improves usability by operators in the field.

Figure 5:
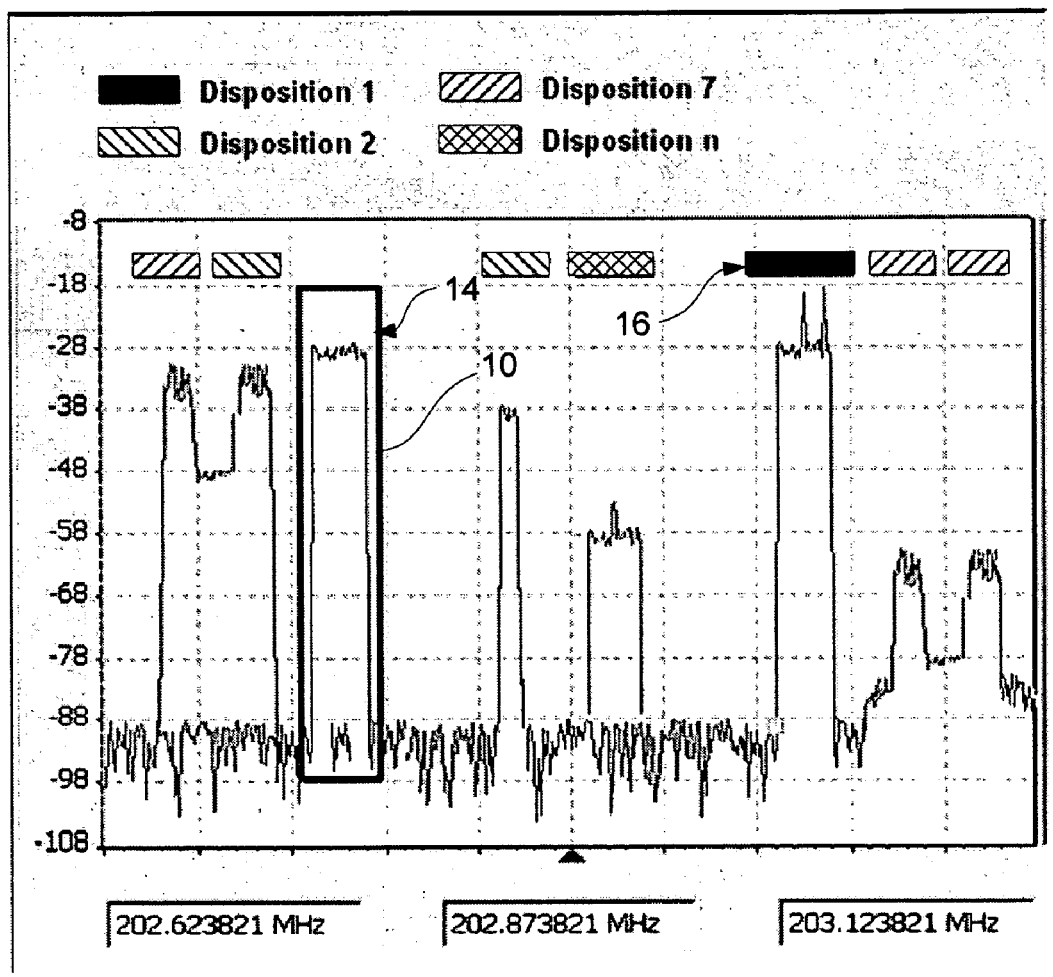
FIG. 5 illustrates a frequency spectrum as displayed on a measurement instrument with a selected region of interest identified according to a parameter.

Parameters for each region can be specified by the user and stored. These parameters may be applied to a single region, or a group of regions based upon user input. In an embodiment of the present invention, the border around the selected region and the bars representing the unselected region are color coded to correspond to a given parameter. As shown in FIG. 5, the hatching is provided to represent color. Note that there is a solid black outline 14 on the selected region 10, as well as one solid black unselected region 16. As shown in the legend, the color corresponds to a disposition parameter, such as known, unknown, etc. Disposition is a useful parameter for use in connection with signal identification, particularly when working on the identification of suspect signals, such as those signals which should not be in that spectrum based upon government designations. Additional parameters such as Signal Type Name (a signal type name, including "none", for the signal found in the given region), Signal Instance Name (a signal instance name related to the frequency allocation, channel or band, possibly "none"), Descriptive Names (a descriptive name for a region, which may default to the signal type name), and Comments (user annotations associated with a region, which may be set to "blank" by default) may also be identified with color coding. This color coding allows a user to quickly, visually separate regions of interest based upon a desired criteria. In an alternative embodiment, for example one employing a black and white display, hatching may be used instead of color. In a further embodiment, line patterns may also be used, such as dashed or dotted lines.

In an embodiment of the present invention, a collection of regions of interest is created and stored. The collection may consist of a single region of interest, or a plurality of regions of interests. A collection may consist of all defined regions of interest. Alternatively, the collection may correspond to those regions of interest that presently appear on the screen. The collection may be specified by the user by selecting multiple regions of interest. The selection may be made by drawing a box around multiple unselected regions of interest, by holding down a key, such a ctrl key, while selecting each desired region in turn. The collection may be selected based upon a parameter associated with the region of interest. For example, the disposition as to whether a region of interest corresponds to a known, or unknown, signal may be used to create a collection.

A stored collection may be retrieved. Once retrieved an additional region of interest may be added, or a region of interest may be deleted from the collection. The collection may then be resaved to store the modified version of the collection.

In a further embodiment, a timestamp is associated and stored along with the collection to provide a temporal reference. A collection may then be retrieved based upon the timestamp associated with it.

In an additional embodiment, a geographic reference is associated with the collection. This is useful because the RF spectral energy content varies with geography, in part due to local government allocation of the available spectrum, or industry adoption of different communications standards in different regions or simply due to physics of RF propagation. In some embodiments, the geographic reference is provided by user input. In other embodiments, the geographic reference is provided by a global positions system (GPS) or similar system. In a further embodiment, a GPS enabled instrument is set to automatically recall and display a collection based upon the instrument's current location.

A collection may be created manually as a database, or table, using a text-based, tabular format such as a spreadsheet. This would allow a collection of regions of interest to be provided prior to sending the user out into the field to take measurements.

In a further embodiment of the present instrument, the parameters of a region of interest are used to automatically identify signal types, and frequency allocations. Many signal types can be determined based upon the range of frequency spectrum. Accordingly, a signal type can be associated with a region of interest. For example, GSM is a signal type with a bandwidth of approximately 200 kHz. Any region created with a bandwidth within a specified tolerance of 200 kHz will trigger a database consultation resulting in several signal types being returned, including GSM, along with other signal types that also have a 200 kHz bandwidth, such as analog FM. The specified tolerance may be provided as a default when the measurement instrument ships. The specified tolerance may also be set by a user. The greater the tolerance the greater the chance of obtaining a false positive, while a tolerance set too low may result in a false negative. When the bandwidth of a region is changed, as described above, the database is automatically rechecked to see if new signal types are now applicable.

Once a list of candidate signal types is provided, the user may select from the list. Once a signal type is selected, a frequency allocation database is consulted using the region of interest's center frequency and selected signal type. In a further embodiment, when the selected signal type corresponds to a signal having a frequency allocation divided into channels, then the channel with the closest frequency to the center frequency of the region of interest is determined. Both the channel and its frequency would be available. A channel refers to frequency bands containing one signal type spaced at known intervals.

In an alternative embodiment, a frequency allocation database is selected using the region of interest's center frequency and the provided tolerance value. This second search further reduces the possible signal types and frequency allocations.

Once both final selection based on bandwidth, and frequency allocations is completed a list of possible candidates may be provided for final user selection. In the case of only one possible candidate, that value may be selected automatically, or displayed for confirmation and selection by the user.

Figure 6:
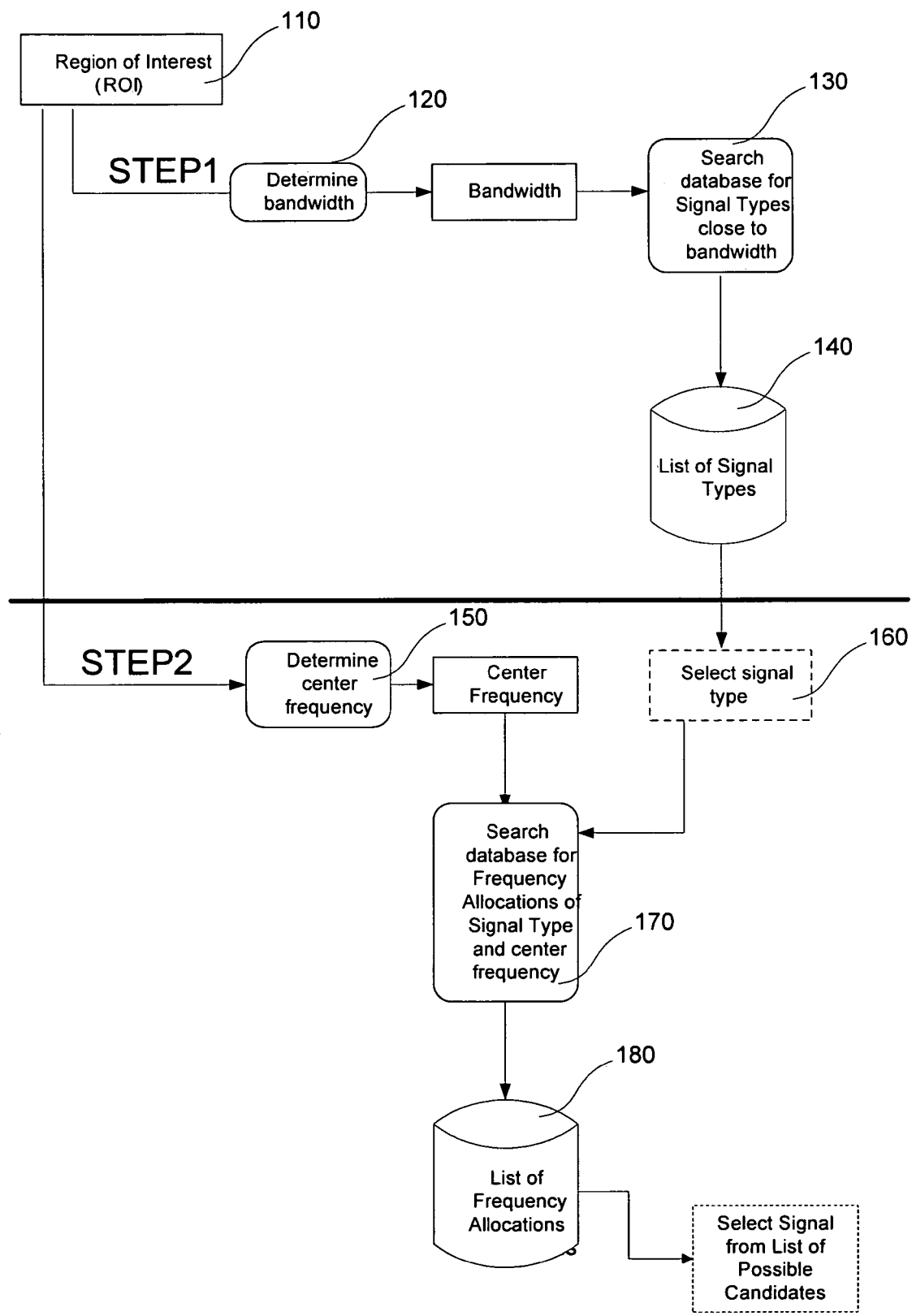
FIG. 6 illustrates the process for identifying signal types based on upon the selected region of interest.

The diagram in FIG. 6 illustrates an embodiment of the present method. A region of interest is defined by a user, or selected by a user from an available collection of previously defined regions of interest 110. The bandwidth of the region of interest is determined 120, possibly along with the tolerance, and a search 130 is performed to produce a list of signal types 140 that correspond to the bandwidth of the region of interest. If no satisfactory results are provided, the user may redefine the bandwidth of the region of interest, or increase the tolerance.

The center frequency of the region of interest is determined 150. As shown by the dashed line, in some embodiments the user selects a signal type from the list of signal types 160. A search 170 is performed for frequency allocations based on signal types, and center frequency values, along with a tolerance for the center frequency. A list of frequency allocations 180 is provided based upon the defined regions of interest. The user may select a signal from the list provided. In an alternative embodiment, no user selection is made from the list of signal types prior to searching the frequency allocations.

For example, if the region of interest has a bandwidth that is within the tolerance of 200 kHz, a list of signal types will be provided, including GSM. Based upon the optional user selection of GSM, a frequency allocation table is searched. A Channel/Frequency table is searched for all channels with of the selected Signal Type within the frequency range. If the search is for a GSM signal within 1% tolerance of a region of interest's center frequency of 1933.09 MHz the following table would represent a list of the possible candidates. In an embodiment of the present invention, the user could select from this list. In an alternative embodiment Channel 526 may be automatically selected as being the closest to the center frequency of the region of interest.

| Signal Type | Channel | Frequency |
|---|---|---|
| GSM | 521 | 1932.0 MHz |
| GSM | 522 | 1932.2 MHz |
| GSM | 523 | 1932.4 MHz |
| GSM | 524 | 1932.6 MHz |
| GSM | 525 | 1932.8 MHz |
| GSM | 526 | 1933.0 MHz |
| GSM | 527 | 1933.2 MHz |
| GSM | 528 | 1933.4 MHz |
| GSM | 529 | 1933.6 MHz |
| GSM | 530 | 1933.8 MHz |

In a further embodiment, a geographic reference input is provided. The geographic reference may be provided by user input, or by a GPS. Rather than search all known signal types, only the signal types that apply to the region of the world where the measurement instrument is currently located are searched. The same can be provided for the frequency allocations, so that only known frequency allocations that apply to the region of the world where the measurement instrument is currently located are searched.

As shown in FIG. 6 the bandwidth is searched first followed by the frequency allocations. In an alternative embodiment, the frequency allocations are searched first. One of ordinary skill would be readily able to implement this alternative based upon the existing teaching provided herein.

The user interface functionality and the signal type identification features described above may be implemented as computer program code operating on a test instrument. This program code is provided embodied within a computer readable medium, such as a hard drive, magnetic media, optical media, flash memory, memory card, firmware, or implemented as part of an field programmable gate array.

What is claimed is:

1. A method of identifying a signal type comprising:
   obtaining a frequency spectrum of a radio frequency signal using a measurement instrument;
   determining a bandwidth of a region of interest of the frequency spectrum;
   searching a database for signal types within a specified tolerance of the bandwidth;
   determining a center frequency of the region of interest;
   searching the database for signal types within a specified tolerance of the center frequency;
   providing a list of possible signal type candidates; and
   narrowing the list of possible signal type candidates based upon the geographic location of the measurement instrument at the time the frequency spectrum is obtained.

2. The method of claim 1, wherein the geographic location is determined using global positioning system (GPS) information.

3. The method of claim 1, wherein the geographic location is provided by a user.

4. A non-transitory computer usable storage medium containing computer instructions stored therein for causing a computer processor to perform:
   obtaining a frequency spectrum of a radio frequency signal;
   determining a bandwidth of a region of interest of the frequency spectrum;
   searching a database for signal types within a specified tolerance of the bandwidth;
   determining center frequency of the region of interest;
   searching the database for signal types within a specified tolerance of the center frequency;
   providing a list of possible signal type candidates; and
   narrowing the list of possible signal type candidates based upon geographic location of a measurement being performed.

5. The non-transitory computer usable storage medium of claim 4, wherein the geographic location is determined using global positioning system (GPS) information.

6. The non-transitory computer usable storage medium of claim 4, wherein the geographic location is provided by a user.

* * * * *